US006281046B1

(12) United States Patent
Lam

(10) Patent No.: US 6,281,046 B1
(45) Date of Patent: Aug. 28, 2001

(54) METHOD OF FORMING AN INTEGRATED CIRCUIT PACKAGE AT A WAFER LEVEL

(75) Inventor: Ken M. Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 09/558,396

(22) Filed: Apr. 25, 2000

(51) Int. Cl.$^7$ .......................... H01L 21/44; H01L 21/48; H01L 21/50; H01L 23/48; H01L 23/52; H01L 29/40

(52) U.S. Cl. .................. 438/113; 438/108; 438/615; 438/616; 257/738; 257/778

(58) Field of Search .................. 438/108, 113, 438/615, 616, 652; 257/738, 778

(56) References Cited

U.S. PATENT DOCUMENTS

| 5,569,963 | 10/1996 | Rostoker et al. | 257/773 |
|---|---|---|---|
| 5,604,160 | 2/1997 | Warfield | 437/209 |
| 5,798,557 | 8/1998 | Salatino et al. | 257/416 |
| 5,821,624 | 10/1998 | Pasch | 257/776 |
| 5,851,845 | 12/1998 | Wood et al. | 438/15 |
| 6,004,867 | 12/1999 | Kim et al. | 438/459 |
| 6,020,637 | * 2/2000 | Karnezos | 257/738 |

* cited by examiner

Primary Examiner—Charles Bowers
Assistant Examiner—Nema Berezny
(74) Attorney, Agent, or Firm—Thomas Schneck; Thomas P. McGuire, Jr.

(57) ABSTRACT

A method of forming an integrated circuit package at the wafer level. The integrated circuit package occupies a minimum amount of space on an end-use printed circuit board. Solder bumps, or conductive adhesive, is deposited on the metallized wirebond pads on the top surface of a silicon wafer. An underfill-flux material is deposited over the wafer and the solder bumps. A pre-fabricated interposer substrate, made of metal circuitry and a dielectric base, has a plurality of metallized through-holes which are aligned with the solder bumps. The wafer/interposer assembly is reflowed, or cured, to form the electrical connection between the circuitry on the interposer layer and the circuitry on the wafer. Solder balls are then placed on the metal pad openings on the interposer substrate and are reflowed to form a wafer-level BGA structure. The wafer-level BGA structure is then cut into individual BGA chip packages.

19 Claims, 4 Drawing Sheets

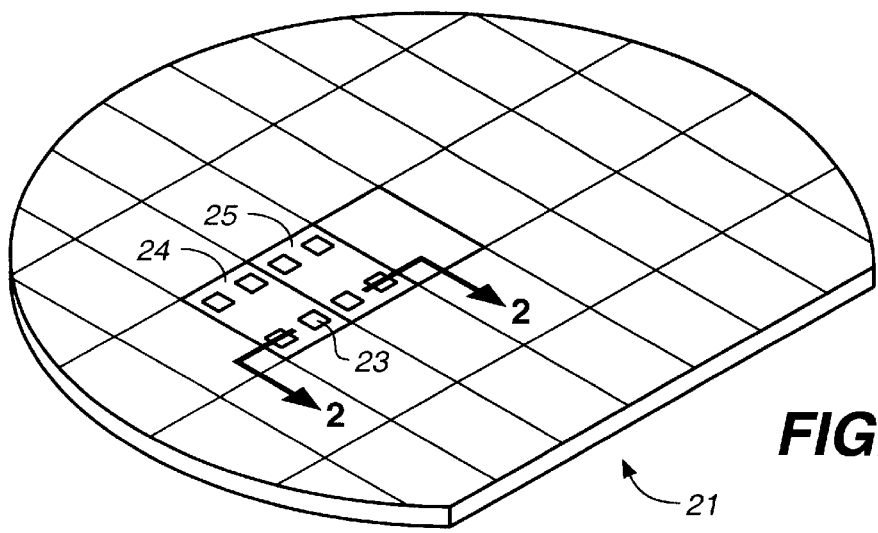
FIG._1
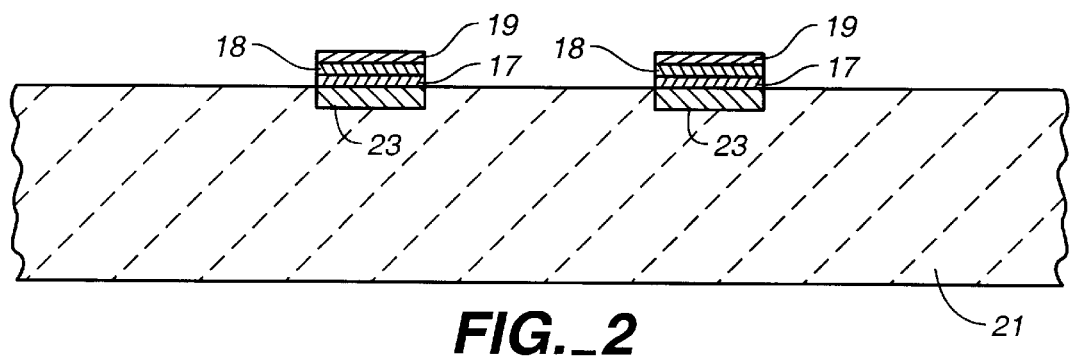
FIG._2
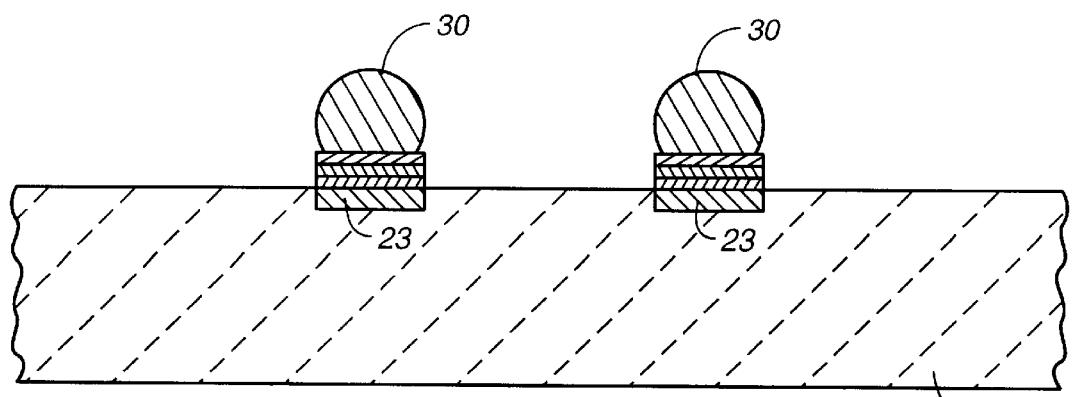
FIG._3

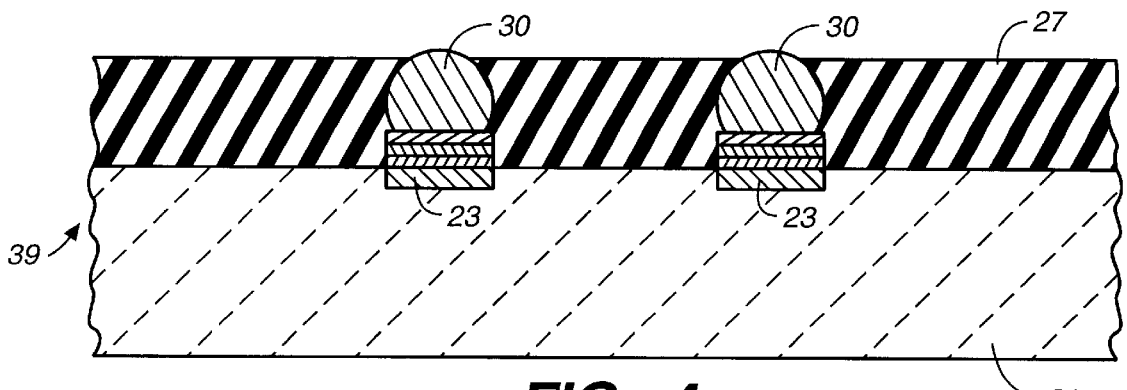
FIG._4
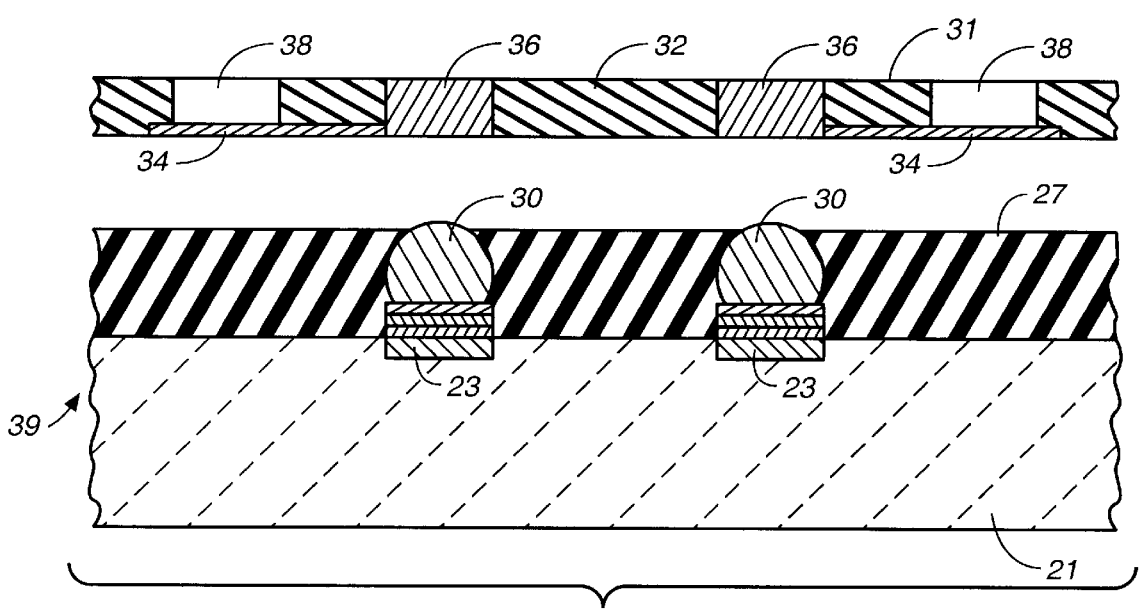
FIG._5
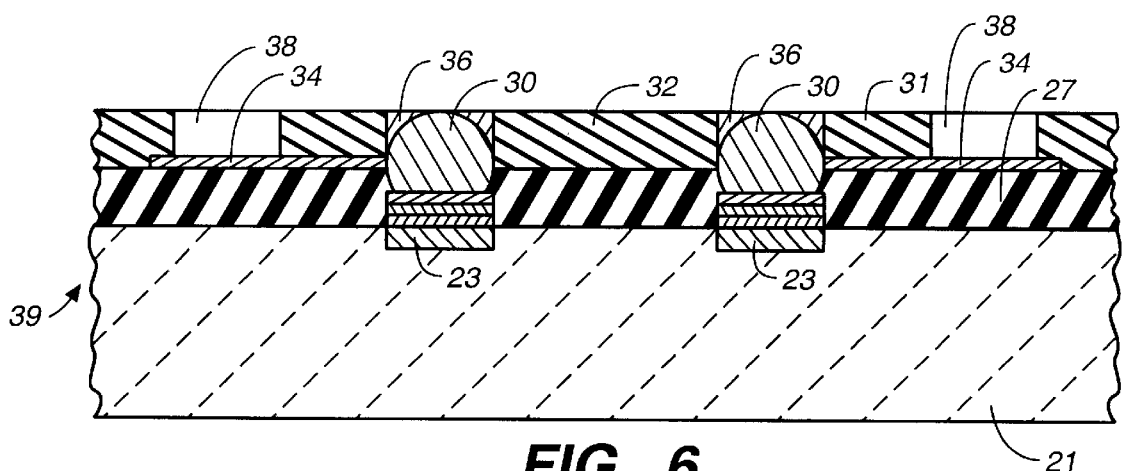
FIG._6

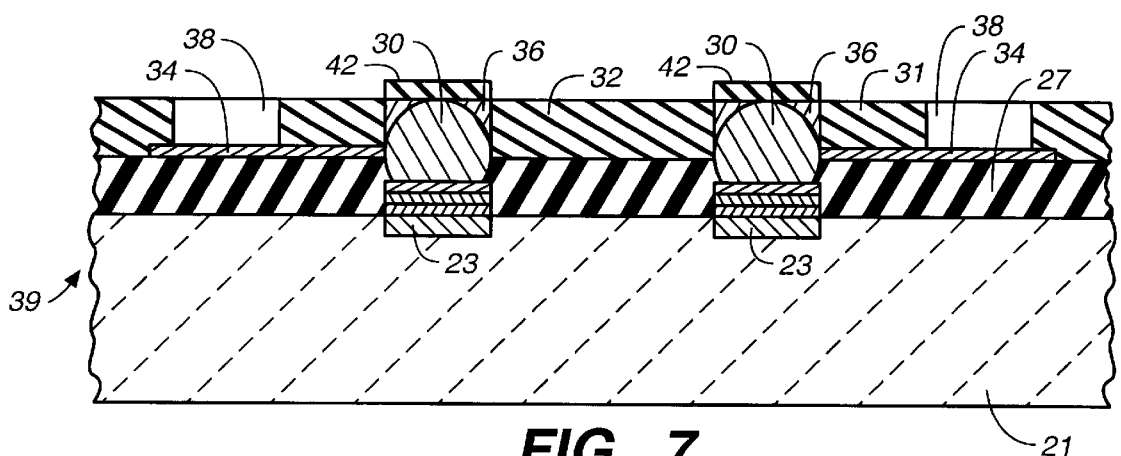
FIG._7
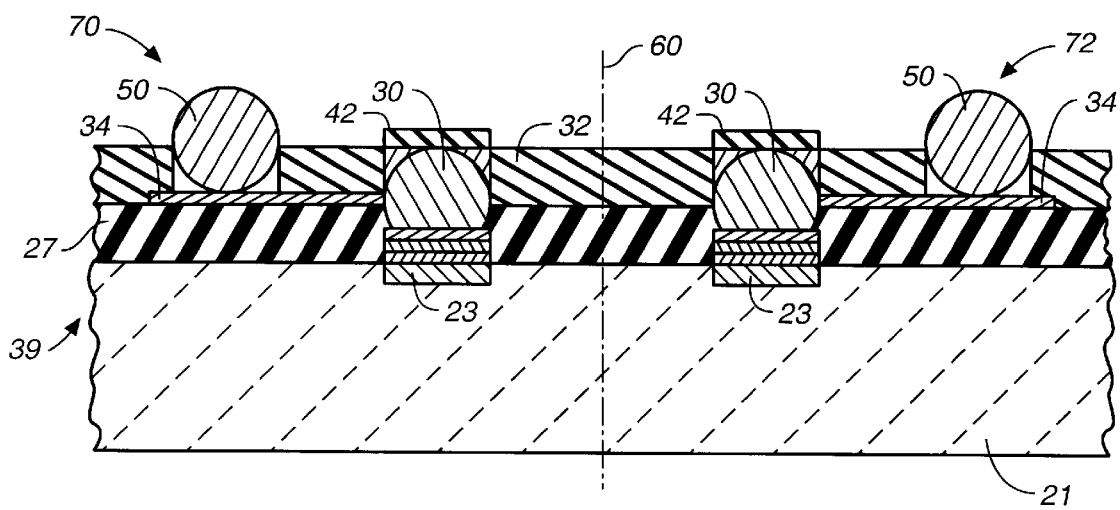
FIG._8
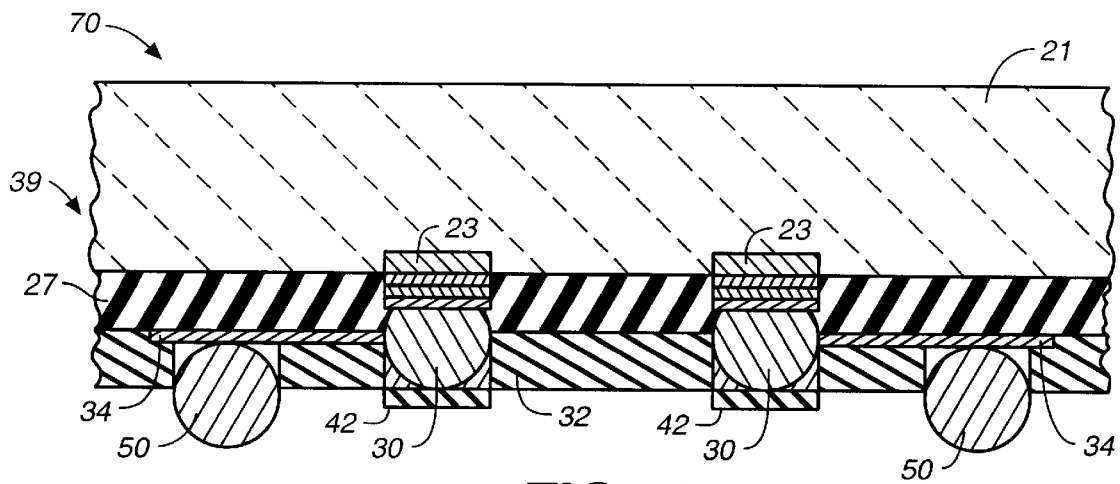
FIG._9

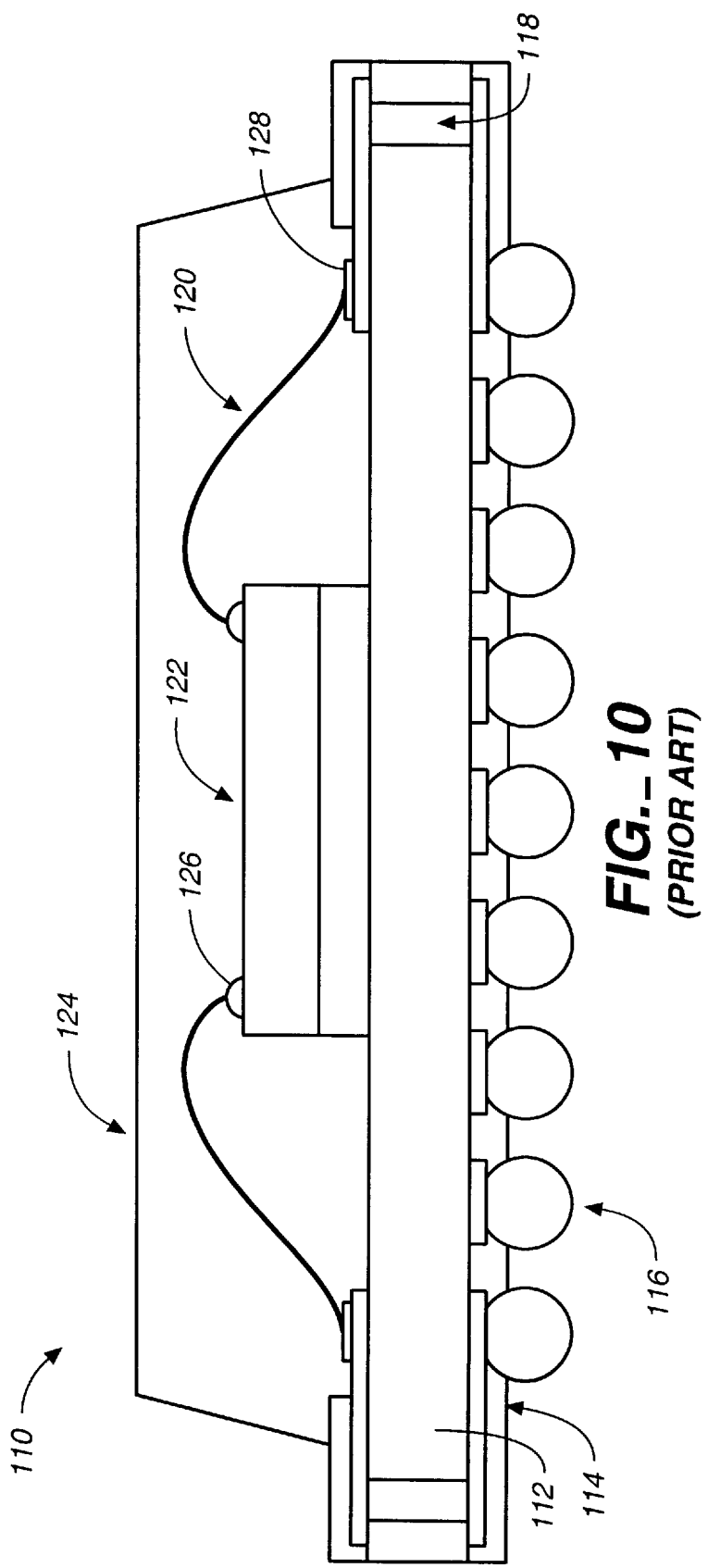
FIG._10
(PRIOR ART)

METHOD OF FORMING AN INTEGRATED CIRCUIT PACKAGE AT A WAFER LEVEL

CROSS-REFERENCE TO RELATED APPLICATION

This application is related to U.S. patent application Ser. No. 09/460,902, filed Dec. 14, 1999.

TECHNICAL FIELD

The invention relates generally to integrated circuit packages, and more specifically to a method of forming a ball-grid array integrated package at a wafer level.

BACKGROUND ART

The footprint of an integrated circuit package on a circuit board is the area of the board occupied by the package. It is generally desired to minimize the footprint and to place packages close together. In recent years, the ball-grid array (BGA) package has emerged as one of the more popular package types because it provides high density, minimum footprint, and shorter electrical paths, which means that it has better performance than previous types of semiconductor packages.

A typical BGA package is shown in FIG. 10. In the BGA package 110, an integrated circuit chip 122 is mounted by means of a bonding layer on an upper surface of a base 112 made of a substrate material. Metal bonding wires or wire-bond leads 120 electrically connect a plurality of metal chip pads 126 formed on the upper surface of the chip 122 with wire bonding pads 128 formed on the upper surface of the base 112. The base 112 includes plated through-hole vias 118 and metal traces 114 to connect the circuitry from the upper surface to the lower surface of the base 112. A plurality of solder balls 116 are placed on the bottom surface of the base 112 and are electrically connected to the metal traces 114 of the base. The solder balls 116 can be arranged in a uniform full matrix array over the entire bottom surface, in a staggered full array, or around the perimeter of the bottom surface in multiple rows. The solder balls are then used to mechanically and electrically secure the chip package onto a printed circuit board in the end-use product.

While the BGA packages of the prior art provide a great improvement over earlier types of packages in terms of high density and high I/O capability, it is always desired to make the IC package even smaller to further decrease the amount of space needed on a printed circuit board to accommodate the package. Because the wirebond leads are of a predetermined length and require a minimum spacing between adjacent bonding sites to provide sufficient room for the bonding tool, the substrate base must be larger than the chip and it is not possible to fabricate a more compact package. Ideally, it is desired to make a package in which the substrate base does not have to be any larger than the size of the chip.

In the prior art, as described above, it is common to fabricate a package for each individual die. Others have realized that it would be advantageous to be able to form the IC package at the wafer level, that is, after the individual chips have been formed on the wafer but before the wafer has been diced into individual chips. This allows for easier mass production of chip packages and for several chip packages, arranged in a matrix format on the wafer, to be manufactured and tested all at one time. This can reduce time and cost in the process of packaging and testing IC chips.

Some examples of packaging methods in the prior art that are conducted at the wafer level include: U.S. Pat. No. 5,604,160 to Warfield, which discloses using a cap wafer to package semiconductor devices on a device wafer; U.S. Pat. No. 5,798,557 to Salatino et al., which describes a wafer level hermetically packaged integrated circuit having a protective cover wafer bonded to a semiconductor device substrate wafer; and U.S. Pat. No. 5,851,845 to Wood et al., which discloses a method of forming a semiconductor package by providing a wafer containing a plurality of dice, thinning a backside of the wafer by polishing or etching, attaching the thinned wafer to a substrate, and then dicing the wafer.

It is the object of the present invention to provide a ball-grid array IC package that has a minimum size such that the IC package takes up no more space than the area of the IC chip.

It is a further object of the invention to provide a method of forming such an IC package at the wafer level in order to take advantage of the greater efficiency in mass production and the ability to conduct parallel testing of the IC packages.

SUMMARY OF THE INVENTION

The above objects have been achieved in a method of forming an integrated circuit package on the wafer level using a flip chip design with a single wafer. The integrated circuit package is formed by first providing a product silicon wafer having a plurality of microelectric circuits fabricated thereon and having a plurality of standard aluminum bonding pads exposed. The aluminum bonding pads are re-metallized to be solderable. Then, a plurality of solder bumps are deposited on the bonding pad sites. Then, a layer of underfill-flux material is deposited onto the wafer surface, over the solder bumps. A pre-fabricated interposer substrate, having metallized through-holes, is aligned to the wafer and then the assembly is reflowed, or cured, to secure the interposer substrate to the layer of underfill-flux material, and to form the electrical connection between the circuitry on the substrate and the bonding pads on the silicon wafer. Solder balls are then placed on the metal pad openings on the interposer substrate and are then reflowed forming a BGA structure. The wafer is then diced and the individual BGA packages are formed. The BGA package is ready for the next level assembly.

The integrated circuit package of the present invention is smaller than BGA packages of the prior art in that the additional space usually required because of the use of wirebonding leads is not necessary. The whole wafer can be packaged all at one time which is more efficient than packaging each die individually and allows for parallel testing of the packaged dice while still in wafer form. Additionally, the method of the present invention is easy to implement because, since the solder bumps are defined first, there is no need to be concerned with keeping the bonding pads clean for later addition of solder during the step of adding the adhesive (underfill-flux) layer. Also, since the solder bumps are already in place, it makes it easier to align the solder bumps to the plated through-holes of the interposer substrate.

BRIEF DESCRIPTION OF THE DRAWINGS

FIG. 1 is a perspective view of a silicon wafer having a plurality of chips formed on a top surface.

FIG. 2 is a cross-sectional view of a section 2—2 of the silicon wafer shown in FIG. 1 with the bonding pads re-metallized.

FIGS. 3–7 are cross-sectional views of the silicon wafer of FIG. 1 showing the various process steps used in forming the IC package of the present invention.

FIG. 8 is a cross-sectional view of the silicon wafer of FIG. 1, showing the finalized wafer assembly for the IC package of the present invention.

FIG. 9 is a cross-sectional view of the finalized IC package of the present invention.

FIG. 10 is a cross-sectional view of a ball-grid array package as known in the prior art.

BEST MODE FOR CARRYING OUT THE INVENTION

With reference to FIG. 1, a silicon wafer 21 has a plurality of microcircuits fabricated thereon. The microcircuits are arranged into a matrix of individual chips or dice 24, 25. A plurality of aluminum bonding pads 23 are arranged around the perimeter of each of the chips. In prior art packaging operations, the wafer 21 is usually diced at this point into individual chips, and each of the individual chip is then packaged. In the present invention, the chips are formed on the wafer but are not diced until the packaging operation on the wafer has been completed, thus the packaging of the chip is conducted at the wafer level.

With reference to FIG. 2, a section 2—2 of the wafer 21 is shown, with the aluminum bonding pads 23 being exposed on a top surface of the wafer 21. The first step in the packaging process, is to re-metallize the aluminum bonding pads 23 in order to make the bonding pads solderable. Aluminum, which is commonly used for the wirebond pads of IC's, is a less than ideal metal for use in solder connections due to the fact that the aluminum tends to oxidize which creates solder wetting problems. In the forming of the IC package of the present invention, the aluminum bonding pads need to be wetable by solder or have a low ohmic contact resistance for application of a conductive adhesive. Therefore, the bonding pads need to be re-metallized. One process for re-metallizing the bonding pads, that is inexpensive and convenient to implement, is to use electroless nickel-gold plating. First, a layer of zinc 17 is deposited on the aluminum bonding pads 23, then a layer of electroless nickel plating 18 is deposited on the layer of zinc. The zinc layer 17 acts as an adhesion layer between the nickel plating 18 and the aluminum bond pads 23. Then, a layer of electroless gold plating 19 is deposited on top of the electroless nickel plating 18 to form a nickel-gold plating in order to make the bonding pads 23 conducive to soldering. Alternatively, another thin film metallization scheme can be carried out to re-metallize the bonding pads.

Next, with reference to FIG. 3, a plurality of solder bumps 30 are deposited on the wirebond pad sites 23. This can be carried out by a screen or stencil printing process. The surface of the wafer 21 is screened off and the solder paste is deposited onto the bonding pads 23 by a pneumatic squeegee so that the solder paste is deposited on the wafer all at one time. The solder paste can also be deposited on the bonding pads by the use of automatic dispensing equipment or by solder preform placement. Alternatively, the solder can be electrolytically plated or evaporated onto the wafer. The wafer is processed through solder reflow equipment, such as a solder reflow furnace, to form the solder bumps 30. Another alternative is to use an electrically conductive adhesive, in lieu of the solder paste.

Next, referring to FIG. 4, a layer of adhesive 27 is deposited on the top surface of the wafer 21. The adhesive can be made of an underfill-flux material. The underfill-flux material has two functions. Firstly, it acts as a flux to clean metallic oxide from the solder and the soldering surface. Secondly, the underfill-flux material acts as an adhesive and a sealant. The adhesive layer 27 can be applied through a screen printing process in which the underfill-flux material is pushed through the openings of a stencil or a mesh screen. The screen is mounted onto a screen printer and is precisely positioned with respect to the wafer. A certain amount of the underfill-flux material is dispensed along one edge of the screen and a pneumatic squeegee presses down on the screen as it sweeps across it, sheering the material at a constant pressure. The material acquires higher flowability above certain shear stresses, which allows it to go through the screen and fill the gaps left by the wire mesh of the screen. The area above the bonding pads 23 does not need to be blocked because the solder bumps are already defined and because the underfill-flux material also acts as a solder flux. The screen is removed and a uniform layer of the material is formed on top of the wafer. Alternatively, a B-staged underfill-flux preform can be used to bond the wafer 21 to the backside of an interposer substrate layer. The underfill-flux layer, when cured, acts as an encapsulant, providing environmental protection for the wafer. The underfill-flux also acts as a buffer layer for the wafer 21 from external stresses, such as a thermal coefficient of expansion mismatch between the wafer and the package solder balls used for mounting the IC package, or a mismatch between the wafer and an end-use printed circuit board on which the IC package would be mounted.

With reference to FIG. 5, an interposer substrate layer 31 with plated through-holes is then aligned to the solder bumps 30 over the underfill-flux layer 27 and will be secured to the underfill-flux layer 27 and solder bumps 30 to form a wafer/interposer assembly 39. The interposer substrate 31 is a preformed substrate consisting of metal circuitry 34 and a dielectric base 32. The metal circuitry 34 typically consists of copper traces formed throughout the substrate. The interposer substrate 31 can also include solder resist coatings to help define solder wetable areas on the copper metal circuitry. The metal circuitry 34 can be formed on a single layer or on multiple layers of the interposer substrate 31. The copper metal circuitry can be nickel-gold plated or coated by an organic material which is used to preserve the copper from oxidation. The dielectric base material 32 is typically made of a polyamide base substrate. Alternatively, BT resin and other epoxy-glass substrates can also be used as the dielectric base material 32. A key feature of the interposer substrate 31 is a plurality of openings 38 on the metal circuitry 34. The metal circuitry 34 generally serves as interconnect circuitry, as the traces can be routed throughout the substrate to interconnect the circuits from the various bonding pads 23 to the Input/Output (I/O) interconnects which will be added to the wafer/interposer assembly 39 through the plurality of openings 38, as described later with reference to FIG. 8.

The interposer substrate 31 can be approximately the same size as the wafer 21 and is aligned to the wafer 21 such that the through-holes 36 line up with the bonding pads 23. A sufficient amount of copper must be present in the through-holes 36 to provide adequate connection for solder or for a conductive adhesive. A circular copper ring around the through-holes 36 or a copper strip across the through-holes 36 can be used to facilitate this requirement.

With reference to FIG. 6, the interposer substrate 31 is then adhered to the wafer 21 by the underfill-flux material 27 and the wafer/interposer assembly 39 is then cured. Thus, the interposer is aligned and bonded to the wafer.

Optionally, with reference to FIG. 7, an epoxy coating material 42 can be used to protect the solder connections. Application of the epoxy coating material 42 would also be by the screen or stencil printing process described above and the protective coating would then be cured.

The next step is to place package solder balls on the wafer/interposer assembly. The package solder balls serve as the I/O interconnects for the final IC package and will be used to secure the completed IC package to an end-use printed circuit board. With reference to FIG. 8, the solder balls 50 are placed on the plurality of openings 38 through a mechanical transfer of pre-formed solder balls and then are reflowed onto the metallized openings. Alternatively, the solder balls 50 can be formed by screen or stencil printing solder paste. The solder is then reflowed to form the package solder balls. An electrical and mechanical connection is made between the solder balls 50 and the metal circuitry 34 of the interposer substrate, and thus an electrical and mechanical connection is made between the solder balls 50 and the bonding pads 23 of the wafer 21. The solder balls 50 are applied in whatever type of pattern is desired, such as in a uniform full matrix over the entire surface.

At this point, electrical testing may be conducted on the wafer/interposer assembly 39 since the wafer assembly 39 contains finished dice arranged in a matrix format. This allows for parallel testing, which can be conducted at the wafer level and can provide savings in testing time and cost. Then the wafer/interposer assembly 39 is diced, or singulated, such as along line 60, to form individual chip-size BGA packages 70, 72. A common technique for the singulation is to use a wafer saw with diamond or resinoid saw blades. With reference to FIG. 9, the finished BGA package 70 can then be mounted on the end-use printed circuit board in the same manner as prior art BGA packages. The BGA package 70 of the present invention has the same footprint as the individual silicon die, as no extra space is needed to accommodate wirebond leads or larger substrate bases. In this way, the integrated circuit package of the present invention provides the advantages of a smaller package size and the convenience of packaging at the wafer level.

What is claimed is:

1. A method of forming an integrated circuit chip package on a wafer level, comprising:
    providing a silicon wafer having a plurality of bonding pads disposed on a first surface thereof;
    depositing a conductive material on the plurality of bonding pads;
    depositing an underfill-flux material on the first surface of the wafer;
    securing an interposer substrate, composed of a dielectric material and a plurality of metallized traces, to the layer of underfill-flux material to form a wafer/interposer assembly, the interposer substrate including a plurality of metallized through-holes which are aligned to the plurality of bonding pads and including a plurality of openings on a surface of the interposer substrate over the plurality of metallized traces;
    forming an electrical connection between the plurality of through-holes and the plurality of bonding pads;
    attaching a plurality of I/O interconnects through the plurality of openings to the metallized traces of the interposer substrate; and
    dicing the wafer/interposer assembly into a plurality of individual integrated circuit chip packages.

2. The method of claim 1 wherein the conductive material is a plurality of solder bumps formed on the plurality of bonding pads.

3. The method of claim 2 wherein the step of forming an electrical connection between the plurality of through-holes and the plurality of bonding pads includes reflowing the solder bumps to the interposer substrate.

4. The method of claim 1 wherein the conductive material is a conductive adhesive applied to the plurality of bonding pads.

5. The method of claim 4 wherein the step of forming an electrical connection between the plurality of through-holes and the plurality of bonding pads further comprises curing the conductive adhesive to the metallized openings of the interposer substrate.

6. The method of claim 1 wherein the step of securing the interposer substrate to the underfill-flux material includes curing the underfill-flux material.

7. The method of claim 1 wherein the plurality of I/O interconnects are a plurality of solder balls.

8. The method of claim 7 wherein the step of attaching the plurality of I/O interconnects through the plurality of openings to the metallized traces includes:
    placing the plurality of solder balls on the plurality of openings; and
    reflowing the plurality of solder balls to form a plurality of interconnections.

9. The method of claim 1 further comprising after the step of forming an electrical connection between the plurality of through-holes and the plurality of bonding pads, applying an epoxy coating over the through-holes.

10. The method of claim 1 further comprising after the step of providing a silicon wafer, re-metallizing the plurality of bonding pads.

11. The method of claim 10 wherein the step of re-metallizing the plurality of bonding pads includes:
    depositing a layer of zinc on each of the bonding pads;
    depositing a layer of electroless nickel plating on top of the layer of zinc on each of the bonding pads; and
    depositing a layer of electroless gold plating over the layer of electroless nickel plating on each of the bonding pads.

12. A method of forming an integrated circuit chip package on a wafer level, comprising:
    providing a silicon wafer having a plurality of bonding pads disposed on a first surface thereof;
    depositing a plurality of solder bumps on the plurality of bonding pads;
    depositing an underfill-flux material on the first surface of the wafer;
    aligning an interposer substrate composed of a dielectric material and a plurality of metallized traces, to the solder bumps on the wafer, the interposer substrate including a plurality of metallized through-holes which are aligned to the plurality of solder bumps;
    reflowing the solder bumps to the through-holes of the interposer substrate to form an electrical connection and securing the interposer substrate to the underfill-flux material to form a wafer/interposer assembly;
    attaching a plurality of I/O interconnects through a plurality of openings on a surface of the interposer substrate to the metallized traces; and
    dicing the wafer/interposer assembly into a plurality of individual integrated circuit chip packages.

13. The method of claim 12 wherein the step of securing the interposer substrate to the underfill-flux material includes curing the underfill-flux material.

14. The method of claim 12 wherein the plurality of I/O interconnects are a plurality of solder balls.

15. The method of claim 14 wherein the step of attaching the plurality of I/O interconnects through the plurality of openings to the metallized traces includes:

placing the plurality of solder balls on the plurality of openings; and reflowing the plurality of solder balls to form a plurality of interconnections.

16. The method of claim 12 further comprising after the step of forming an electrical connection between the plurality of through-holes and the plurality of bonding pads, applying an epoxy coating over the through-holes.

17. The method of claim 12 further comprising after the step of providing a silicon wafer, re-metallizing the plurality of bonding pads.

18. The method of claim 17 wherein the step of re-metallizing the plurality of bonding pads includes:

depositing a layer of zinc on each of the bonding pads;

depositing a layer of electroless nickel plating on top of the layer of zinc on each of the bonding pads.

19. A method of forming an integrated circuit chip package on a wafer level, comprising:

providing a silicon wafer having a plurality of bonding pads disposed on a first surface thereof;

re-metallizing the plurality of bonding pads;

depositing a plurality of solder bumps on the plurality of bonding pads;

depositing an underfill-flux material on the first surface of the wafer, aligning an interposer substrate, composed of a dielectric material and a plurality of metallized traces, to the solder bumps on the wafer, the interposer substrate including a plurality of metallized through-holes which are aligned to the plurality of solder bumps;

reflowing the solder bumps to the metallized through-holes of the interposer substrate to form an electrical connection and curing the underfill-flux material to secure the underfill-flux material to the interposer substrate to form a wafer/interposer assembly;

applying an epoxy coating over the through-holes;

attaching a plurality of I/O interconnects through a plurality of openings on a surface of the interposer substrate to the metallized traces; and dicing the wafer/interposer assembly into a plurality of individual integrated circuit chip packages.

\* \* \* \* \*